United States Patent
Kishimoto et al.

(10) Patent No.: US 10,423,030 B2
(45) Date of Patent: Sep. 24, 2019

(54) IMAGE DISPLAY HAVING PARTIALLY DRIVEN LIGHT SOURCES AND WAVELENGTH-SELECTIVE REFLECTION FILM

(71) Applicant: Dexerials Corporation, Shinagawa-ku, Tokyo (JP)

(72) Inventors: Koichi Kishimoto, Utsunomiya (JP); Yasushi Ito, Utsunomiya (JP); Tomomitsu Hori, Utsunomiya (JP); Noritaka Sato, Utsunomiya (JP)

(73) Assignee: Dexerials Corporation, Shinagawa-ku, Tokyo (JP)

( * ) Notice: Subject to any disclaimer, the term of this patent is extended or adjusted under 35 U.S.C. 154(b) by 0 days.

(21) Appl. No.: 15/570,884

(22) PCT Filed: Aug. 9, 2016

(86) PCT No.: PCT/JP2016/003679
§ 371 (c)(1),
(2) Date: Oct. 31, 2017

(87) PCT Pub. No.: WO2017/068740
PCT Pub. Date: Apr. 27, 2017

(65) Prior Publication Data
US 2018/0292712 A1    Oct. 11, 2018

(30) Foreign Application Priority Data

Oct. 23, 2015 (JP) .................................. 2015-209126
May 19, 2016 (JP) .................................. 2016-100772

(51) Int. Cl.
*G02F 1/00* (2006.01)
*G02F 1/1335* (2006.01)
(Continued)

(52) U.S. Cl.
CPC ........ *G02F 1/133605* (2013.01); *C09K 11/08* (2013.01); *C09K 11/56* (2013.01);
(Continued)

(58) Field of Classification Search
USPC .................................................. 362/600–634
See application file for complete search history.

(56) References Cited

U.S. PATENT DOCUMENTS

2007/0285943 A1* 12/2007 Ouderkirk ............ G02B 6/0001
                                                                  362/609
2009/0135339 A1    5/2009  You et al.
(Continued)

FOREIGN PATENT DOCUMENTS

CN      101846849 A      9/2010
JP      2005277127 A     10/2005
(Continued)

OTHER PUBLICATIONS

Apr. 13, 2018, Notification of Reasons for Revocation issued by the Japan Patent Office in the corresponding Japanese Patent No. 6092446.
(Continued)

*Primary Examiner* — Gerald J Sufleta, II
(74) *Attorney, Agent, or Firm* — Kenja IP Law PC

(57) ABSTRACT

Provided is a partial drive-type light source device capable of suppressing coloring of a section intended to be a dark section when a plurality of light-emitting elements is driven in a partial manner. The partial drive-type light source device includes an excitation light source, a phosphor sheet that is disposed at a position separated from the excitation light source and contains a phosphor that releases emitted light in a wavelength region differing from incident light, and a wavelength-selective reflection film that is disposed between the excitation light source and the phosphor sheet
(Continued)

and that transmits at least part of light in the wavelength region of the incident light from the excitation light source and reflects at least part of light in the wavelength region of the emitted light from the phosphor sheet.

17 Claims, 17 Drawing Sheets

(51) Int. Cl.
| | |
|---|---|
| *C09K 11/08* | (2006.01) |
| *C09K 11/56* | (2006.01) |
| *C09K 11/62* | (2006.01) |
| *F21S 2/00* | (2016.01) |
| *F21V 7/00* | (2006.01) |
| *F21V 7/22* | (2018.01) |
| *F21V 9/30* | (2018.01) |
| *H01L 33/46* | (2010.01) |
| *H01L 33/50* | (2010.01) |
| *H01L 25/075* | (2006.01) |
| *C09K 11/61* | (2006.01) |
| *C09K 11/77* | (2006.01) |
| *H01L 33/44* | (2010.01) |
| *H01L 33/60* | (2010.01) |

(52) U.S. Cl.
CPC .......... *C09K 11/567* (2013.01); *C09K 11/617* (2013.01); *C09K 11/62* (2013.01); *C09K 11/621* (2013.01); *C09K 11/7774* (2013.01); *F21S 2/00* (2013.01); *F21V 7/00* (2013.01); *F21V 7/22* (2013.01); *F21V 9/30* (2018.02); *G02F 1/133609* (2013.01); *H01L 25/0753* (2013.01); *H01L 33/46* (2013.01); *H01L 33/507* (2013.01); *G02F 1/133514* (2013.01); *G02F 1/133603* (2013.01); *G02F 1/133606* (2013.01); *G02F 2001/133601* (2013.01); *G02F 2001/133614* (2013.01); *G02F 2203/09* (2013.01); *H01L 33/44* (2013.01); *H01L 33/502* (2013.01); *H01L 33/60* (2013.01)

(56) References Cited

U.S. PATENT DOCUMENTS

| | | | |
|---|---|---|---|
| 2009/0147497 A1* | 6/2009 | Nada .................... | G02B 6/0023 362/84 |
| 2010/0238381 A1* | 9/2010 | Oshima ............. | G02F 1/133603 349/71 |
| 2010/0238648 A1 | 9/2010 | Tsukahara | |
| 2010/0270566 A1 | 10/2010 | Cheng et al. | |
| 2012/0012864 A1 | 1/2012 | Xie et al. | |
| 2015/0378089 A1* | 12/2015 | Oba .................... | G02B 6/0068 349/70 |
| 2016/0070047 A1* | 3/2016 | Okuyama ............. | G02B 6/005 349/71 |
| 2017/0219885 A1* | 8/2017 | Tanaka ............. | G02F 1/133603 |
| 2017/0315405 A1* | 11/2017 | Masuda .................. | G02B 5/20 |

FOREIGN PATENT DOCUMENTS

| | | |
|---|---|---|
| JP | 2007081234 A | 3/2007 |
| JP | 2008505441 A | 2/2008 |
| JP | 2009158462 A | 7/2009 |
| JP | 2010019958 A | 1/2010 |
| JP | 2010170961 A | 8/2010 |
| JP | 2013068728 A | 4/2013 |
| JP | 2015032373 A | 2/2015 |
| JP | 2015065158 A | 4/2015 |
| KR | 20120050720 A | 5/2012 |
| KR | 20140082631 A | 7/2014 |
| KR | 20140094806 A | 7/2014 |
| WO | 2006007109 A1 | 1/2006 |
| WO | 2012128323 A1 | 9/2012 |
| WO | 2014112525 A1 | 7/2014 |

OTHER PUBLICATIONS

Apr. 26, 2018, International Preliminary Report on Patentability issued in the International Patent Application No. PCT/JP2016/003679.
May 1, 2018, Notification of Reasons for Revocation issued by the Japan Patent Office in the corresponding Japanese Patent No. 6178027.
May 8, 2018, Office Action issued by the Korean Intellectual Property Office in the corresponding Korean Patent Application No. 10-2017-7031694.
Dec. 20, 2017, Notification of Reasons for Revocation issued by the Japan Patent Office in the corresponding Japanese Patent No. 6092446.
Feb. 27, 2018, Office Action issued by the Korean Intellectual Property Office in the corresponding Korean Patent Application No. 10-2017-7031694.
Apr. 25, 2017, Notification of Reasons for Refusal issued by the Japan Patent Office in the corresponding Japanese Patent Application No. 2017-021584.
Nov. 15, 2016, International Search Report issued in the International Patent Application No. PCT/JP2016/003679.
Nov. 8, 2016, Notification of Reasons for Refusal issued by the Japan Patent Office in the corresponding Japanese Patent Application No. 2016-100772.
Sep. 6, 2016, Notification of Reasons for Refusal issued by the Japan Patent Office in the corresponding Japanese Patent Application No. 2016-100772.
Jun. 27 2017, Decision to Grant a Patent issued by the Japan Patent Office in the corresponding Japanese Patent Application No. 2017-021584.
Jul. 6, 2018, the Extended European Search Report issued by the European Patent Office in the corresponding European Patent Application No. 16857064.6.
Aug. 1, 2018, Office Action issued by the Korean Intellectual Property Office in the corresponding Korean Patent Application No. 10-2017-7031694.
Sep. 26, 2018, Notification of Reasons for Revocation issued by the Japan Patent Office in the corresponding Japanese Patent No. 6178027.
Sep. 13, 2018, Office Action issued by the State Intellectual Property Office in the corresponding Chinese Patent Application No. 201680025996.9.
Apr. 3, 2019, Decision on Opposition issued by the Japan Patent Office in the corresponding Japanese Patent No. 6178027.

\* cited by examiner

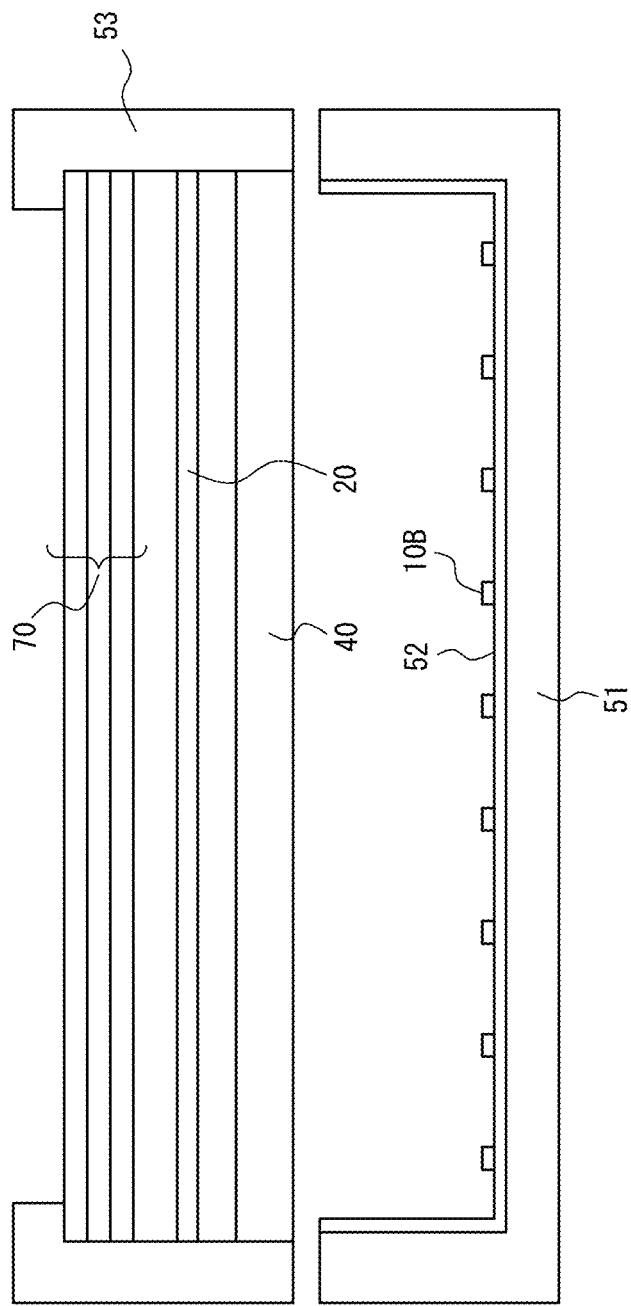

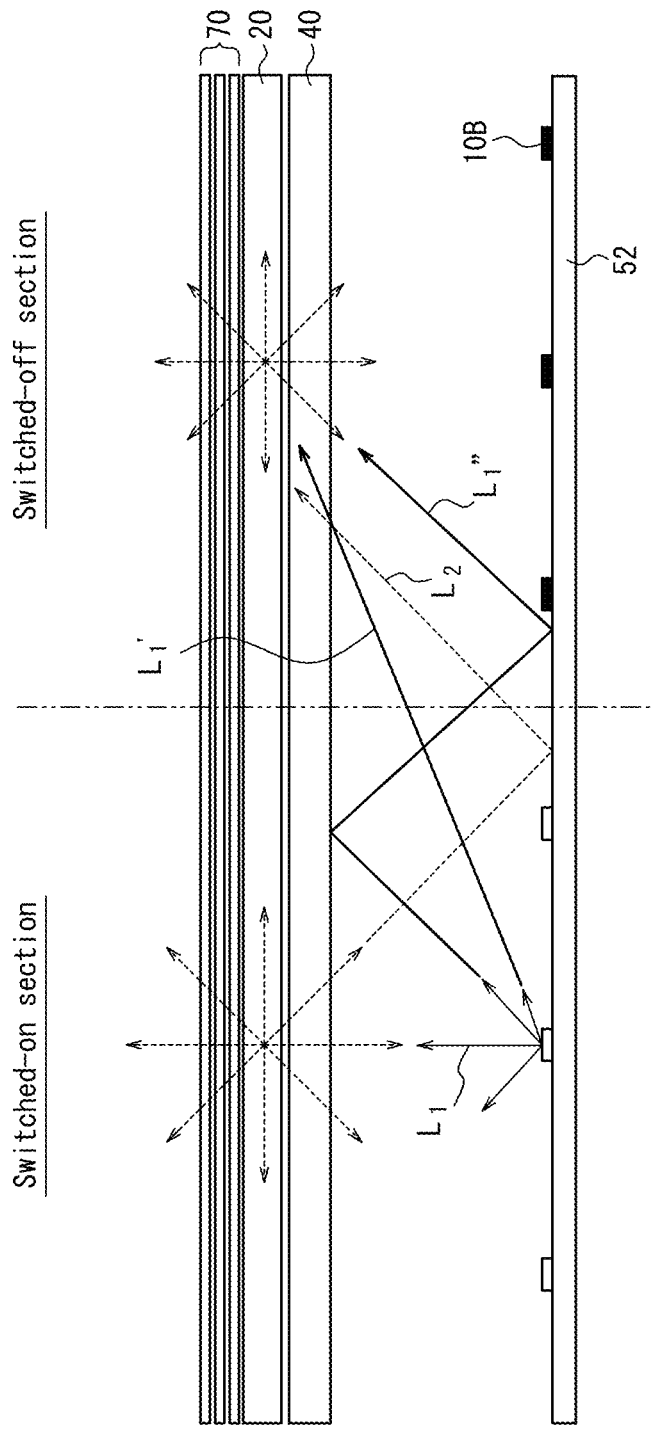

IMAGE DISPLAY HAVING PARTIALLY DRIVEN LIGHT SOURCES AND WAVELENGTH-SELECTIVE REFLECTION FILM

CROSS-REFERENCE TO RELATED APPLICATION

This application claims priority of Japanese Patent Application No. 2015-209126 (filed on Oct. 23, 2015) and Japanese Patent Application No. 2016-100772 (filed on May 19, 2016), the entire disclosure of which is incorporated into this application for reference.

TECHNICAL FIELD

This disclosure relates to a partial drive-type light source device and an image display device that uses this partial drive-type light source device, and particularly to a partial drive-type light source device having a remote phosphor system.

BACKGROUND

Liquid-crystal displays, plasma displays, active matrix organic EL (active matrix organic light-emitting diode (AMOLED)) displays, and the like are conventionally used in the technical field of flat panel displays. In terms of the light source of these displays, liquid-crystal displays are classified as back-lit displays, whereas plasma displays and active matrix organic EL displays are classified as self-emitting displays.

Back-lit liquid-crystal displays are known to have poor bright-dark contrast compared to self-emitting displays because it is necessary for the backlight thereof to be switched on even when displaying a dark image and thus the screen luminance is not sufficiently reduced (referred to as "black floating", or "black level maladjustment").

A technique of divided control of switched-on regions of a backlight has been adopted to solve this problem of "black floating". This technique is referred to as partial driving, and may also be referred to as "area driving", "backlight driving", or "local dimming". In a partial drive-type backlight, LEDs that serve as a light source of the backlight are switched on brightly at sections within a single screen where a bright image is to be displayed (bright sections). On the other hand, the luminance of LEDs is reduced at sections where a dark image is to be displayed (dark sections). This improves the luminance contrast between bright sections and dark sections of an image.

However, even in the case of a partial drive-type backlight, it may not be possible to benefit from the improvement in luminance contrast provided by partial driving in a situation in which the number of screen divisions for which partial control is performed is small and in which both a bright section and a dark section are present within a single partially driven control region. This is because when both a bright section and a dark section are present within a single control region, it is necessary for LEDs to be switched on with high luminance in accordance with this bright section, and thus light from the backlight faintly leaks into the partial dark section within the control region.

Therefore, it is preferable that the number of partial drive divisions of a screen is a large as possible such that the partial driving functions effectively at a fine level with respect to the screen. For this reason, partial drive-type backlights referred to as "direct backlights" that enable a large number of divisions to be made are attracting attention.

A light source device that functions as a backlight is typically formed from a light-emitting section that includes green and red light-emitting phosphors or a yellow light emitting phosphor, and LEDs that serve as an excitation light source for the phosphor(s). A phosphor is commonly used in one of the following three configurations. In a first configuration, the phosphor is mixed with a resin material and the resultant mixture is used to cover an LED chip. In a second configuration, the phosphor is applied directly onto a light emission surface of an LED. In a third configuration, a structure in which an LED and a phosphor sheet that contains the phosphor are at separated positions (hereinafter, referred to in this specification as a "remote phosphor system") is adopted (for example, PTL 1).

The following provides a more specific description of a remote phosphor system direct backlight (i.e., a backlight having the third configuration described above) according to conventional techniques with reference to the schematic view illustrated in FIG. 1. In the direct backlight illustrated in FIG. 1, blue LEDs 10B that serve as an excitation light source are arrayed in a grid shape on a chassis 51 and a reflection sheet 52 is disposed at the inside of the chassis 51, except for at positions where the blue LEDs 10B are disposed. A diffusing plate 40, a phosphor sheet 20, and an optical sheet group 70 are disposed in this order above the blue LEDs 10B and are held by a sheet securing member 53. Note that the phosphor sheet 20 is separated from the blue LEDs 10B. When the blue LEDs 10B serving as an excitation light source for the phosphor sheet 20 emit light, this light is incident on the phosphor sheet 20 as excitation light, and the phosphor sheet 20 releases emitted light in a wavelength region from red to green. The incident light from the blue LEDs 10B and the emitted light from the phosphor sheet 20 combine to form white light.

At present, the first configuration is most commonly adopted among the first to third configurations described above. However, in the first and second configurations, the phosphor may be directly affected by heat and light resulting from LED light emission. Moreover, in the case of a phosphor that is easily degraded by moisture in air, it may be necessary to adopted a structure in which the whole of the resin in which the phosphor is dispersed in protected from moisture. Accordingly, there are many cases in which the third configuration is preferable to the first and second configurations for technical and cost-related reasons. Therefore, the use of a remote phosphor system corresponding to this third configuration is attracting interest for cases in which a phosphor that is easily degraded by heat or light or a phosphor that is easily degraded by moisture is used.

CITATION LIST

Patent Literature

PTL 1: JP 2009-158462 A

SUMMARY

Technical Problem

The inventors conducted studies in relation to improving the bright-dark contrast of a remote phosphor system direct backlight as a partial drive-type backlight. In a case in which the backlight illustrated in FIG. 1 is driven in a partial manner, an area above a switched-on region of the blue LEDs 10B (light-emitting elements) becomes bright and an area above a switched-off region of the blue LEDs 10B becomes dark as illustrated schematically in FIG. 2A. Note that in FIG. 2A, blue LEDs 10B that are colored white are switched on and blue LEDs 10B that are colored black are switched off. The same also applies to FIG. 4. In other drawings, white and black coloring is not intended to distinguish between light-emitting elements 10 or blue LEDs 10B being switched on or off. In the case illustrated in FIG. 2A, the switched-on region of the blue LEDs 10B is limited to a central region. When the switched-on region of the blue LEDs 10B is controlled as illustrated in FIG. 2A, a bright section is displayed at a central section of an image and a dark section is displayed at a section (section indicated by downward hatching to the right in the drawing) other than the central section as schematically illustrated by an image pattern in FIG. 2B, and improved luminance contrast of the bright section and the dark section is expected.

However, in the case of an actually produced sample of a partially driven direct backlight having a remote phosphor system, it was determined that, as schematically illustrated by an image pattern in FIG. 3, there is a problem of light entering from the phosphor sheet into a region (section indicated by downward hatching to the left in the drawing) surrounding the bright section at the center of the image, and causing a phenomenon in which part of the section that is intended to be a dark section suffers from increased yellowness (hereinafter, the phenomenon is referred to in this specification as "coloring").

Accordingly, an objective of this disclosure is to provide a partial drive-type light source device capable of suppressing coloring of a section intended to be a dark section when a plurality of light-emitting elements is driven in a partial manner.

Solution to Problem

The inventors conducted diligent research to achieve the objective set forth above and investigated the cause of coloring. The inventors considered the following effects (1) and (2) as causes of coloring. The following refers to the schematic view illustrated in FIG. 4 to describe the mechanism of coloring as based on the inventors' research. In FIG. 4, solid lines represent blue light and dashed lines represent light in a wavelength region from red to green (or alternatively, light in a wavelength region of the yellow region). Note that transmission and release of blue light by the phosphor sheet 20 is omitted to simplify the drawing.

(1) Among emitted light from the phosphor sheet 20 at a switched-on section side, backward returning light $L_2$ enters a switched-off section. $L_2$ is richer in light in a wavelength region from red to green than blue light. Among light in the wavelength region from red to green that is emitted from the phosphor sheet, half of this emitted light exits externally (upward in FIG. 4) and half of this emitted light becomes backward returning light. The proportion of blue light that returns backward is smaller than the light in the wavelength region from red to green. Moreover, the backward returning light $L_2$ undergoes color conversion again upon entering the phosphor sheet of the switched-off section. This results in an increase in a red-green component compared to light exiting from the switched-on section.

(2) Among emitted light from blue LEDs 10B at the switched-on section side, reflected light $L_1''$ that is reflected by both the diffusing plate 40 and the reflection sheet 52 enters the phosphor sheet 20 at the switched-off section side, and is released from the phosphor sheet 20 as light in the wavelength region from red to green. Moreover, among emitted light from the blue LEDs 10B at the switched-on section side, light $L_1'$ that is obliquely incident at a shallow angle on the phosphor sheet 20 at the switched-off section side is released from the phosphor sheet 20 as light in the wavelength region from red to green. It is though that as a consequence of the light $L_1'$ and the light $L_1''$ being incident obliquely on the phosphor sheet at the switched-off section side, a greater amount of blue light may be converted by the phosphor due to the light path for this light being longer than at the switched-on section side.

Through diligent research, the inventors confirmed that, in reality, effect (1) dominates as the cause of coloring. In consideration of the above, the inventors conceived an idea of providing, between an excitation light source and a phosphor sheet, a wavelength-selective reflection film that transmits incident light from the excitation light source and reflects emitted light from the phosphor sheet. Moreover, the inventors conceived an idea of adopting LEDs with which a phosphor is used in the first or second configuration described above for a remote phosphor system while also using this wavelength-selective reflection film. The inventors discovered that the wavelength-selective reflection film enables significant suppression of coloring in a partial drive-type light source device having a remote phosphor system, leading to completion of the presently disclosed techniques.

This disclosure is based on the inventors' findings set forth above and provides the following as a solution to the aforementioned problems. Specifically, this disclosure provides:

<1> A partial drive-type light source device comprising:
an excitation light source that is formed from a plurality of light-emitting elements and is partially drivable;
a phosphor sheet disposed at a position separated from the excitation light source and containing a phosphor that converts at least part of a wavelength region of incident light from the excitation light source and releases emitted light in a wavelength region differing from the incident light; and
a wavelength-selective reflection film that is disposed between the excitation light source and the phosphor sheet and that transmits at least part of light in the wavelength region of the incident light from the excitation light source and reflects at least part of light in the wavelength region of the emitted light from the phosphor sheet.

The partial drive-type light source device described in <1> can suppress coloring of a section intended to be a dark section when the plurality of light-emitting elements is driven in a partial manner.

<2> The partial drive-type light source device according to the foregoing <1>, wherein
the phosphor sheet and the wavelength-selective reflection film are disposed adjacently.

<3> The partial drive-type light source device according to the foregoing <1>, wherein
the phosphor sheet and the wavelength-selective reflection film are in an integrated form.

<4> The partial drive-type light source device according to any one of the foregoing <1> to <3>, wherein
the plurality of light-emitting elements of the excitation light source is in a grid-shaped array.

<5> The partial drive-type light source device according to any one of the foregoing <1> to <4>, further comprising
a diffusing plate disposed between the excitation light source and the wavelength-selective reflection film.

<6> The partial drive-type light source device according to any one of the foregoing <1> to <5>, wherein the light-emitting elements are blue LEDs.

<7> The partial drive-type light source device according to the foregoing <6>, wherein the wavelength-selective reflection film transmits at least part of a light emission wavelength region of the blue LEDs and reflects at least part of light in a wavelength region from green to red.

<8> The partial drive-type light source device according to any one of the foregoing <1> to <5>, wherein the light-emitting elements are magenta LEDs.

In this specification, the term "magenta LED" refers to an LED having a light emission color that appears magenta to the naked eye. Detailed description is provided further below.

<9> The partial drive-type light source device according to the foregoing <8>, wherein the magenta LEDs are each formed from a blue LED and a red phosphor disposed on a chip upper surface of the blue LED.

<10> The partial drive-type light source device according to the foregoing <9>, wherein a fluoride red light-emitting phosphor is disposed on a chip upper surface in each of the magenta LEDs.

<11> The partial drive-type light source device according to the foregoing <10>, wherein the fluoride red light-emitting phosphor is $K_2SiF_6$.

<12> The partial drive-type light source device according to any one of the foregoing <8> to <11>, wherein the wavelength-selective reflection film transmits at least part of a light emission wavelength region of the magenta LEDs and reflects at least part of light in a green wavelength region.

<13> The partial drive-type light source device according to any one of the foregoing <1> to <12>, wherein the phosphor of the phosphor sheet is a sulfide phosphor.

<14> The partial drive-type light source device according to the foregoing <13>, wherein the sulfide phosphor includes either or both of a red sulfide phosphor and a green sulfide phosphor.

<15> The partial drive-type light source device according to the foregoing <14>, wherein the red sulfide phosphor is a calcium sulfide phosphor and the green sulfide phosphor is a thiogallate phosphor.

<16> The partial drive-type light source device according to any one of the foregoing <1> to <7>, wherein the phosphor of the phosphor sheet is an yttrium cerium aluminum garnet phosphor.

<17> An image display device comprising the partial drive-type light source device according to any one of the foregoing <1> to <16>.

The image display device described in <17> can suppress coloring of a section that is intended to be a dark section.

Advantageous Effect

According to this disclosure, it is possible to solve the conventional problems set forth above, achieve the above-described objective, and provide a partial drive-type light source device capable of suppressing coloring of a section intended to be a dark section when a plurality of light-emitting elements is driven in a partial manner.

BRIEF DESCRIPTION OF THE DRAWINGS

In the accompanying drawings:

FIG. 1 is a schematic view illustrating a remote phosphor system direct backlight according to conventional techniques;

FIG. 4 is a schematic view illustrating a mechanism by which coloring occurs;

DETAILED DESCRIPTION

Figure 2A:
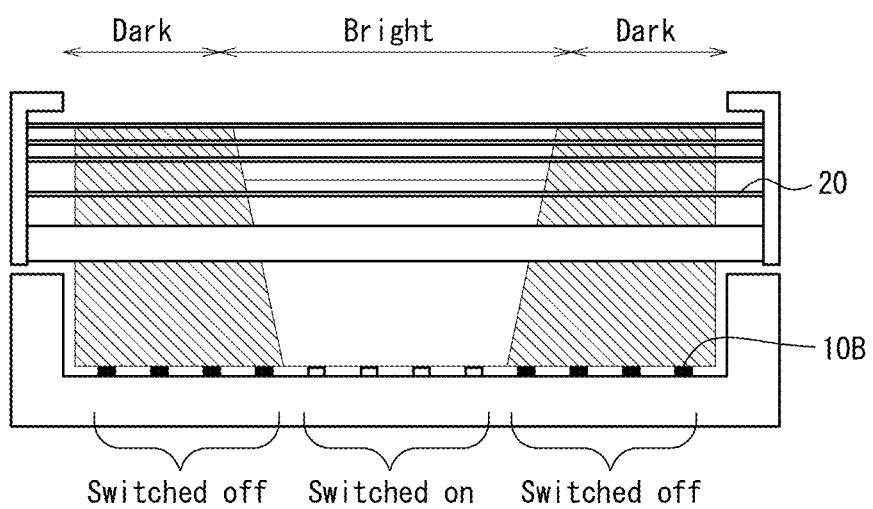
FIG. 2A is a schematic view illustrating a case in which a remote phosphor system direct backlight is partially driven as based on the inventors' research.
Figure 2B:
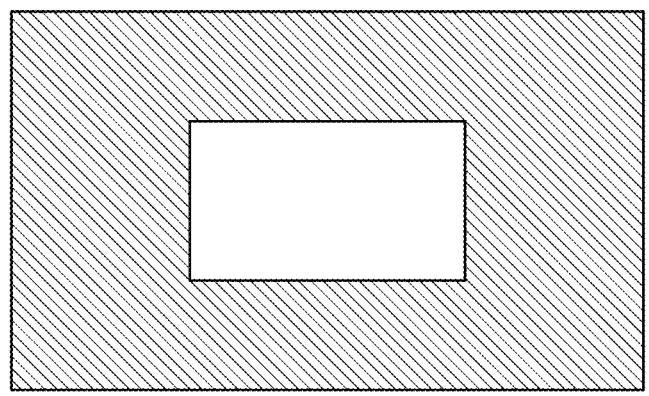
FIG. 2B is a schematic view illustrating a display image pattern predicted by the inventors.
Figure 3:
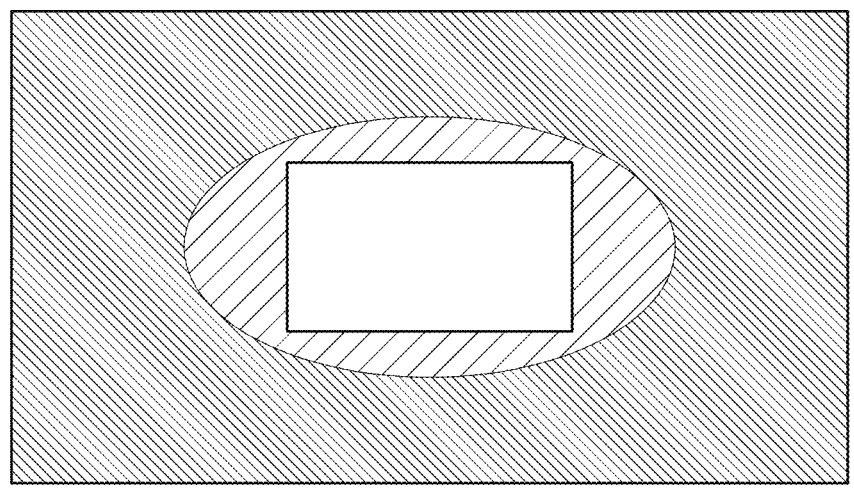
FIG. 3 is a schematic view illustrating coloring that occurs when a remote phosphor system direct backlight is partially driven as discovered through the inventors' research.

The following provides a specific description of the disclosed techniques with reference to the drawings. Note that the sizes of elements in the drawings are schematically illustrated for emphasis and the actual size thereof differs from the illustrated size.

Partial Drive-Type Light Source Device

Figure 5A:
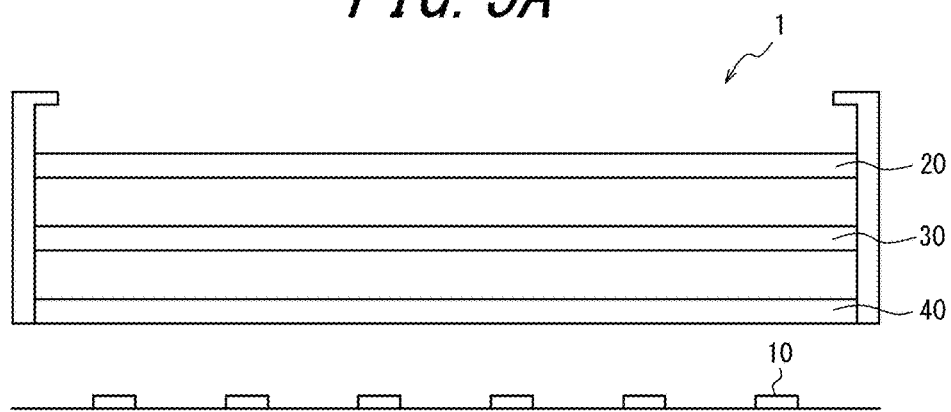
FIG. 5A is a schematic view illustrating the main elements of a partial drive-type light source device 1 according to a disclosed embodiment.

As illustrated in FIG. 5A, a partial drive-type light source device 1 according to one disclosed embodiment includes an excitation light source formed from a plurality of light-emitting elements 10, a phosphor sheet 20, and a wavelength-selective reflection film 30, and may further include other elements as necessary. The partial drive-type light source device 1 is suitable for use as a partial drive-type backlight of a back-lit image display device, such as a liquid-crystal display.

As illustrated in FIG. 5A, the partial drive-type light source device 1 includes a partially drivable excitation light source formed from a plurality of light-emitting elements 10. Moreover, the partial drive-type light source device 1 includes a phosphor sheet 20 that is disposed at a position separated from the excitation light source and contains a phosphor that converts at least part of a wavelength region of incident light from the excitation light source and releases emitted light in a wavelength region differing from the incident light. Furthermore, the partial drive-type light source device 1 includes a wavelength-selective reflection film 30 that is disposed between the excitation light source and the phosphor sheet and that transmits at least part of the wavelength region of the incident light from the excitation light source and reflects at least part of emitted light from the phosphor sheet 20. The following initially provides a description of a first embodiment in which blue LEDs 10B, or LEDs having a central light emission wavelength region at a short wavelength side of blue, are used as the light-emitting elements 10, and then provides a description of a second embodiment in which magenta LEDs 10M are used as the light-emitting elements 10. In principle, elements that are the same are allotted the same reference number and repeated explanation thereof is omitted.

First Embodiment: Partial Drive-Type Light Source Device

<Excitation Light Source>

As previously explained, the excitation light source is formed from a plurality of light-emitting elements 10 and is partially drivable. Any type of light-emitting element that can excite the phosphor of the phosphor sheet 20 may be used as the light-emitting elements 10. However, the light-emitting elements 10 in the first embodiment are preferably blue LEDs 10B. The blue LEDs 10B referred to herein are LEDs having a central light emission wavelength of approximately 440 nm to 475 nm. However, so long as the phosphor of the phosphor sheet 20 can be appropriately excited, the light-emitting elements 10 are of course not limited to LEDs having a central light emission wavelength in the blue region, and ultraviolet LEDs or the like may alternatively be used.

It should be noted that since the light-emitting elements 10 in the first embodiment (inclusive of a case in which blue LEDs 10B are used) are used in a remote phosphor system (third configuration), and not in the previously described first or second configuration, LED chips of the light-emitting elements 10 are not subjected to potting with a phosphor and do not have a phosphor applied onto the light emission surface thereof. The excitation light source is typically positioned inside a chassis as previously described with reference to FIG. 1, but this is not intended as a limitation on positioning conditions of the excitation light source. Moreover, although a control circuit and the like for partial driving are not illustrated, commonly known examples thereof may be adopted.

<Phosphor Sheet>

As previously explained, the phosphor sheet 20 contains a phosphor that converts at least part of a wavelength region of incident light from the excitation light source and releases emitted light in a wavelength region differing from the incident light. In a case in which the excitation light source is blue LEDs 10B, it is preferable to use a phosphor that converts a blue wavelength region and releases emitted light in a wavelength region at a long wavelength side of blue.

Since a remote phosphor system is adopted in the present embodiment, the present embodiment can be adopted irrespective of the type of phosphor used in the phosphor sheet 20. Examples of phosphors that can be used in the phosphor sheet 20 in the present embodiment include sulfide phosphors. In a case in which a sulfide phosphor is used, it is preferable that the phosphor of the phosphor sheet 20 includes either or both of a red sulfide phosphor and a green sulfide phosphor, and more preferable that the phosphor of the phosphor sheet 20 includes both a red sulfide phosphor and a green sulfide phosphor. A calcium sulfide phosphor may be used as the red sulfide phosphor and a thiogallate phosphor may be used as the green sulfide phosphor. Examples of phosphors other than sulfide phosphors that can be used as the phosphor of the phosphor sheet 20 include yttrium aluminum garnet (YAG) phosphors and yttrium cerium aluminum garnet phosphors.

No specific limitations are placed on the spacing between the phosphor sheet 20 and the excitation light source so long as they are disposed at positions separated from one another. However, the spacing therebetween is effective for suppressing the influence of heat and the unevenness of luminance when LEDs are arrayed. Although the unevenness of luminance when LEDs are arrayed changes significantly depending on emission angle distribution design of the LEDs, and also on other elements such as a diffusing plate, optical sheet, or reflection sheet member, the spacing is preferably 10 mm or more.

<Wavelength-Selective Reflection Film>

As previously explained, the wavelength-selective reflection film 30 has a function of transmitting at least part of a wavelength region of incident light from the excitation light source and reflecting at least part of emitted light from the phosphor sheet 20. A wavelength-selective reflection film such as described above is referred to as a dichroic filter and is typically made from a dielectric multilayer film.

The wavelength region of incident light from the excitation light source in the first embodiment is normally a shorter wavelength region than emitted light from the phosphor sheet 20. Accordingly, the wavelength-selective reflection film 30 is preferably a film that reflects long wavelength light while transmitting short wavelength light. In a case in which the excitation light source is blue LEDs 10B, the wavelength-selective reflection film 30 is preferably a film that reflects light in a wavelength region from green to red while transmitting light in a light-emission wavelength region of the blue LEDs (i.e., blue light). Note that since the wavelength-selective reflection film 30 exhibits incident angle dependence, it is preferable that this incident angle dependence is taken into account in selection of threshold values for transmission and reflection.

In the partial drive-type light source device 1 according to the present embodiment, the wavelength-selective reflection film 30 is disposed between the excitation light source and the phosphor sheet 20. This enables significant suppression of coloring that is caused by backward returning light from the phosphor sheet 20 as previously explained.

Figure 5B:
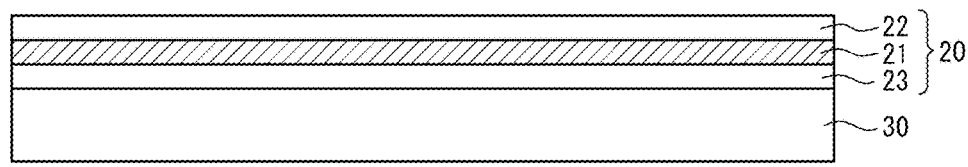
FIGS. 5B and 5C are schematic views illustrating preferred embodiments of a phosphor sheet 20 and a wavelength-selective reflection film 30 in the partial drive-type light source device 1.

In addition to containing the phosphor, the phosphor sheet 20 may include a film for protecting the phosphor. In such a situation, the phosphor sheet 20 may include a phosphor layer 21 and protective films 22 and 23 disposed at opposite sides of the phosphor layer 21 as schematically illustrated in FIG. 5B. The phosphor layer 21 is formed from a material obtained through inclusion of the aforementioned phosphor in a resin composition. The resin composition may be a composition that is commonly known as a material for forming a phosphor layer 21. For example, a polyolefin copolymer component, a photocurable acrylic resin component, and the like may be used. Examples of materials that can be used for the protective films 22 and 23 include plastic substrates of polyethylene terephthalate (PET) or the like and metal oxide thin films of aluminum oxide or the like.

In a situation in which the wavelength-selective reflection film 30 is disposed between the excitation light source and the phosphor sheet 20, the effects of the present embodiment can of course be obtained even when, for example, a gap, a freely selected optical sheet, or the like is present. However, it is preferable that the phosphor sheet 20 and the wavelength-selective reflection film 30 are disposed adjacently as illustrated in FIG. 5B. By disposing the phosphor sheet 20 at a light source side of an optical sheet having light recycling properties, such as a prism sheet, recycled light from the optical sheet can be used to raise wavelength conversion efficiency and thereby enable reduction of the amount of phosphor used in the phosphor sheet 20. The phosphor sheet 20 may, for example, be mounted directly on the wavelength-selective reflection film 30. However, in this case, a fine air layer (not illustrated) may be formed due to fine protrusions and recesses that are unavoidably present at both the surface of the phosphor sheet 20 (more specifically, the protective film 23) and the surface of the wavelength-selective reflection film 30.

Figure 5C:
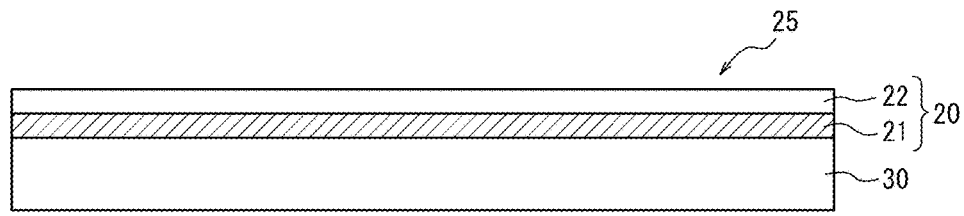

An air layer such as described above reduces light utilization efficiency and may lower luminance of the backlight as a whole because when excitation light that is incident on the phosphor layer 21 passes this interface, part of the light is reflected by the interface. Accordingly, from a viewpoint of further improving light utilization efficiency, a gap or fine air layer such as described above is preferably eliminated. It is more preferable, therefore, to use an integrated sheet 25 in which the phosphor sheet 20 and the wavelength-selective reflection film 30 are in an integrated form as illustrated in FIG. 5C. The phosphor sheet 20 in the integrated sheet 25 includes a phosphor layer 21 and may further include a protective film 22 at one side of the phosphor layer 21. On the other hand, the wavelength-selective reflection film 30 is joined at the opposite side of the phosphor layer 21 relative to the protective film 22 in the integrated sheet 25. Since a resin material having adhesiveness is used for the phosphor layer 21, an integrated sheet 25 such as described above can be obtained by directly joining the phosphor layer 21 and the wavelength-selective reflection film 30, without using the protective film 23 in FIG. 5B.

<Diffusing Plate>

The partial drive-type light source device 1 preferably further includes a diffusing plate 40 as illustrated in FIG. 5A such that the excitation light source becomes a uniform surface light source. The diffusing plate 40 is preferably disposed between the excitation light source and the wavelength-selective reflection film 30. Moreover, the diffusing plate 40 may also function as at least part of a support for the wavelength-selective reflection film 30 and the phosphor sheet 20.

<Optical Sheets>

Although not illustrated, the partial drive-type light source device 1 may further include an optical sheet group including a prism sheet, a light diffusing sheet, and the like, such as commonly used in backlights. The optical sheet group is preferably disposed above the phosphor sheet 20 in FIG. 5A (i.e., at an opposite side of the phosphor sheet 20 to the excitation light source side thereof).

<Method of Producing Integrated Sheet of Phosphor Sheet and Wavelength-Selective Reflection Film>

Figure 6A:
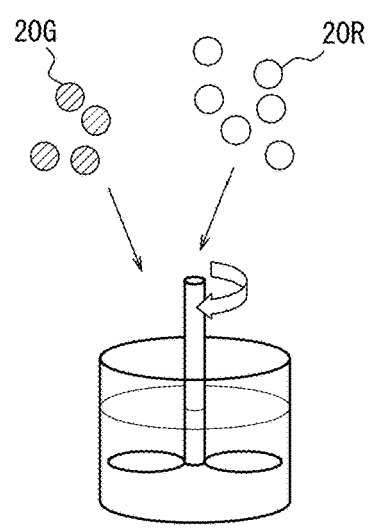
FIGS. 6A, 6B, and 6C are schematic views illustrating steps in an embodiment of a production method for an integrated sheet 25 formed from a phosphor sheet 20 and a wavelength-selective reflection film 30 according to a preferred embodiment.
Figure 6B:
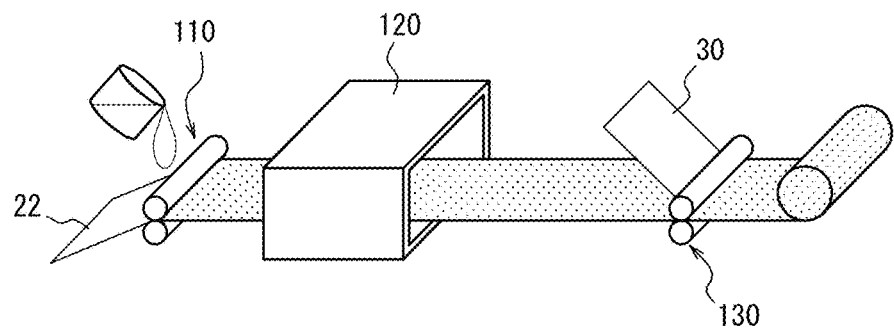
Figure 6C:
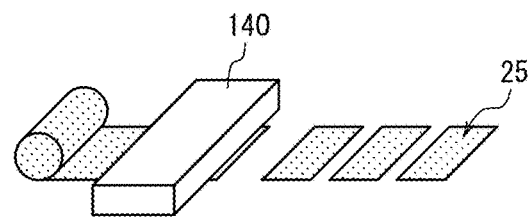

One example of a method for producing an integrated sheet 25 of a phosphor sheet and a wavelength-selective reflection film is described with reference to FIGS. 6A, 6B, and 6C. The integrated sheet 25 can be produced through a stirring step (A) illustrated in FIG. 6A, a lamination step (B) illustrated in FIG. 6B, and a punching step (C) illustrated in FIG. 6C.

In the stirring step (A), a phosphor-containing resin paste is prepared by mixing a red phosphor 20R and a green phosphor 20G with a specific mixing ratio in a resin paste dissolved in a solvent. Alternatively, just one of the red phosphor 20R and the green phosphor 20G may be used. In the lamination step (B), the phosphor-containing resin paste is applied onto a protective film 22, a coater 110 is used to even the film thickness of the phosphor-containing resin paste, and then the phosphor-containing resin paste is dried in an oven 120 to form a phosphor layer 21 (reference sign not illustrated). A heat laminator 130 is used to laminate a wavelength-selective reflection film 30 onto the phosphor layer 21 to obtain a web of an integrated sheet in which the phosphor layer 21 is sandwiched between the protective film 22 and the wavelength-selective reflection film 30. In the punching step (C), the web of the integrated sheet is punched using a press 140 to obtain an integrated sheet 25 of a specific size having the phosphor layer exposed at an end side surface thereof.

Second Embodiment

The above has described a partial drive-type light source device according to the first embodiment in which blue LEDs 10B are preferably used. However, since the presently disclosed partial drive-type light source device can be adopted in any remote phosphor system, the light-emitting elements 10 are not limited to being blue LEDs 10B and may alternatively be magenta LEDs 10M such as described below. The following provides a description of a partial drive-type light source device according to a second embodiment in which magenta LEDs 10M are used. The magenta LEDs 10M can be prepared from an excitation light source such as previously described in the first or the second configuration. In other words, in each of the magenta LEDs 10M, an LED chip is covered with a phosphor that has been mixed with a resin material (first configuration) or a phosphor is directly applied onto a light emission surface of the LED (second configuration). Therefore, a plurality of types of phosphors can be used in the second embodiment by using a certain type of phosphor in the phosphor sheet 20 and using another type of phosphor for the LED chips.

<Excitation Light Source>

In the same way as in the first embodiment, the excitation light source is formed from a plurality of light-emitting elements 10 and is partially drivable. The light-emitting elements 10 used in the second embodiment are preferably magenta LEDs 10M such as described above. In terms of the light emission wavelength of the magenta LEDs 10M in this specification, a central light emission wavelength at a low wavelength side attributable to the LEDs themselves is approximately 440 nm to 475 nm and a central light emission wavelength at a long wavelength side attributable to the phosphor is approximately 600 nm to 680 nm. In the case of a spectrum such as described above, when the LEDs are switched on, blue light from the LEDs and red light emitted from the phosphor due to excitation by the blue light combine to give the LEDs an overall appearance of magenta light emission. A light source having the light emission wavelength described above that is obtained by integrating an LED and a phosphor, either through a resin or through direct application onto the LED light emission surface as described above, can be used as a magenta LED 10M. Note that positioning conditions of the excitation light source, and the control circuit and the like for partial driving are the same as in the first embodiment.

Herein, the magenta LEDs 10M are preferably each formed from a blue LED and a red phosphor disposed on a chip upper surface of the blue LED, and the red phosphor is preferably a fluoride red light-emitting phosphor. Examples of such fluoride red light-emitting phosphors that can be used include $K_2TiF_6$, $Ba_2TiF_6$, $Na_2TiF_6$, $K_3ZrF_7$, and $K_2SiF_6$. In particular, it is preferable to use $K_2SiF_6$ as the fluoride red light-emitting phosphor.

<Phosphor Sheet>

In the second embodiment, the phosphor sheet 20 may contain both a red sulfide phosphor and a green sulfide phosphor in the same way as in the first embodiment, but preferably contains only a green sulfide phosphor. In the same way as in the first embodiment, the phosphor sheet 20 may include a film that protects the phosphor and it is preferable to use an integrated sheet 25 in which the phosphor sheet 20 and the wavelength-selective reflection film 30 are in an integrated form.

<Wavelength-Selective Reflection Film>

In order to correspond to the light emission wavelength region of the magenta LEDs 10M, the wavelength-selective reflection film 30 in the second embodiment preferably transmits at least part of the light emission wavelength region from the magenta LEDs 10M and reflects at least part of light in a green wavelength region. A dichroic filter can be used as this kind of wavelength-selective reflection film 30 in the same way as in the first embodiment.

Accordingly, the second embodiment enables significant suppression of coloring caused by backward returning light from the phosphor sheet 20 in the same way as the first embodiment. Note that it is also preferable for the partial drive-type light source device according to the second embodiment to include a diffusing plate, optical sheets, and so forth in the same way as in the first embodiment. Positioning conditions for each element of the partial drive-type light source device are also the same as for the first embodiment, and thus repeated explanation is omitted.

(Image Display Device)

The presently disclosed image display device includes at least the presently disclosed partial drive-type light source device according to the first and second embodiments described above, and may further include other elements as necessary.

Examples (1)

The following provides a more detailed description of the disclosed techniques through examples, but the disclosed techniques are not in any way limited by the following examples. For example, although sulfide phosphors are used for both a green light-emitting phosphor and a red light-emitting phosphor in a phosphor sheet of the following Experimental Example 1 and a green sulfide phosphor is used in a phosphor sheet of the following Experimental Example 3, these are merely examples, and it should be evident to a person of ordinary skill in the technical field that any phosphor may be used.

Experimental Example 1

Example 1

Figure 7A:
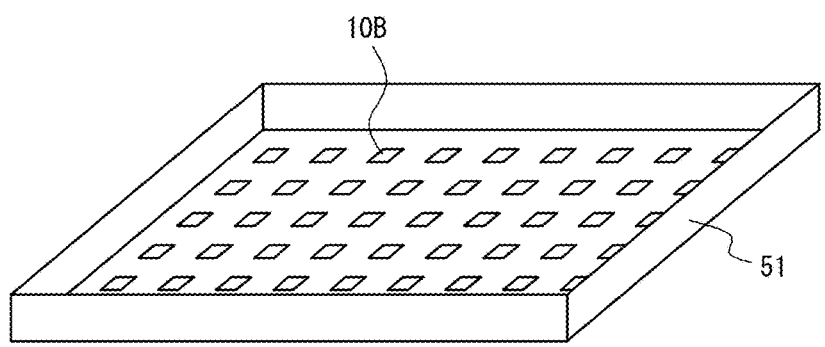
FIG. 7A is a perspective view schematically illustrating positioning of blue LEDs 10B in a backlight used in Experimental Examples 1 and 2.
Figure 7B:
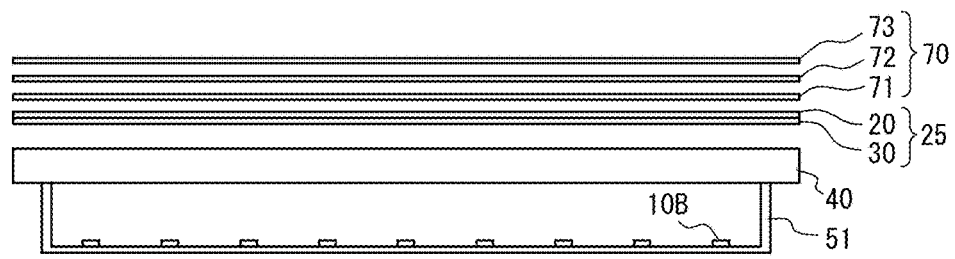
FIG. 7B is a cross-sectional view schematically illustrating the backlight used in Experimental Examples 1 and 2.
Figure 8A:
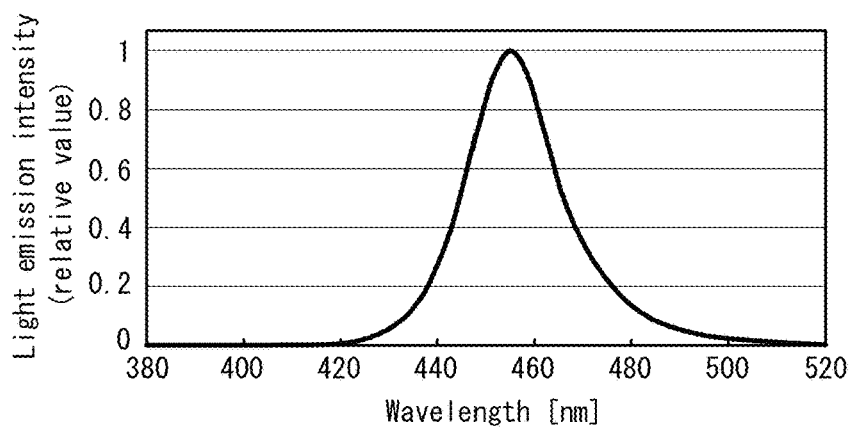
FIG. 8A is a graph illustrating a light emission spectrum of blue LEDs used in Experimental Examples 1 and 2.

A backlight such as illustrated in FIGS. 7A and 7B was produced. Specifically, the produced backlight was configured as follows. A diffusing plate 40 (50S produced by Teijin Limited, thickness 1.5 mm), an integrated sheet 25 formed from a wavelength-selective reflection film 30 and a phosphor sheet 20 (wavelength-selective reflection film 30 positioned at LED side of integrated sheet 25), and an optical sheet group 70 were mounted above blue LEDs 10B in this order, using the side walls of a chassis 51 as a spacer. Note that the blue LEDs 10B had a peak wavelength of 455 nm, a width at half maximum of 21 nm, and a Lambertian light emission distribution. In the present experimental example, approximately 2.8 V was applied to the LEDs and a current of 5 mA per one LED was passed. The blue LED light emission spectrum is illustrated in FIG. 8A.

Figure 8B:
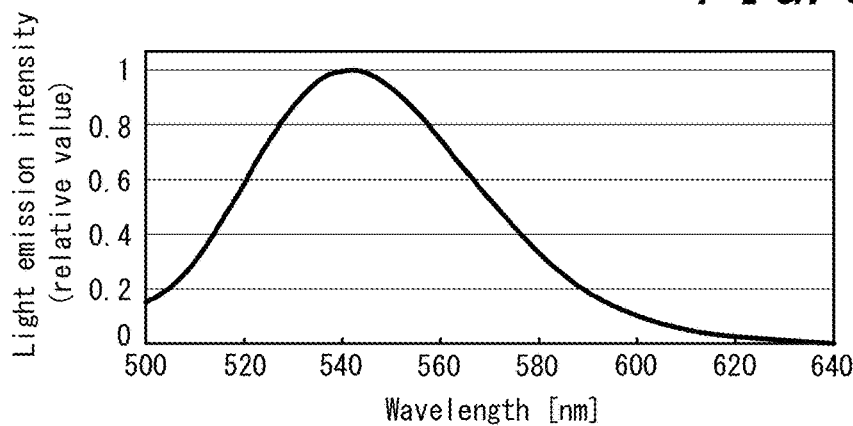
FIG. 8B is a graph illustrating a light emission spectrum of a green light-emitting phosphor used in Experimental Example 1.
Figure 8C:
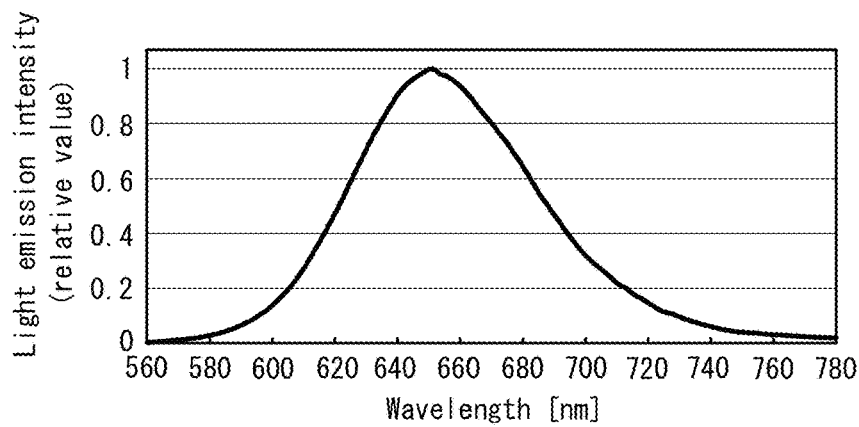
FIG. 8C is a graph illustrating a light emission spectrum of a red light-emitting phosphor used in Experimental Example 1.
Figure 9:
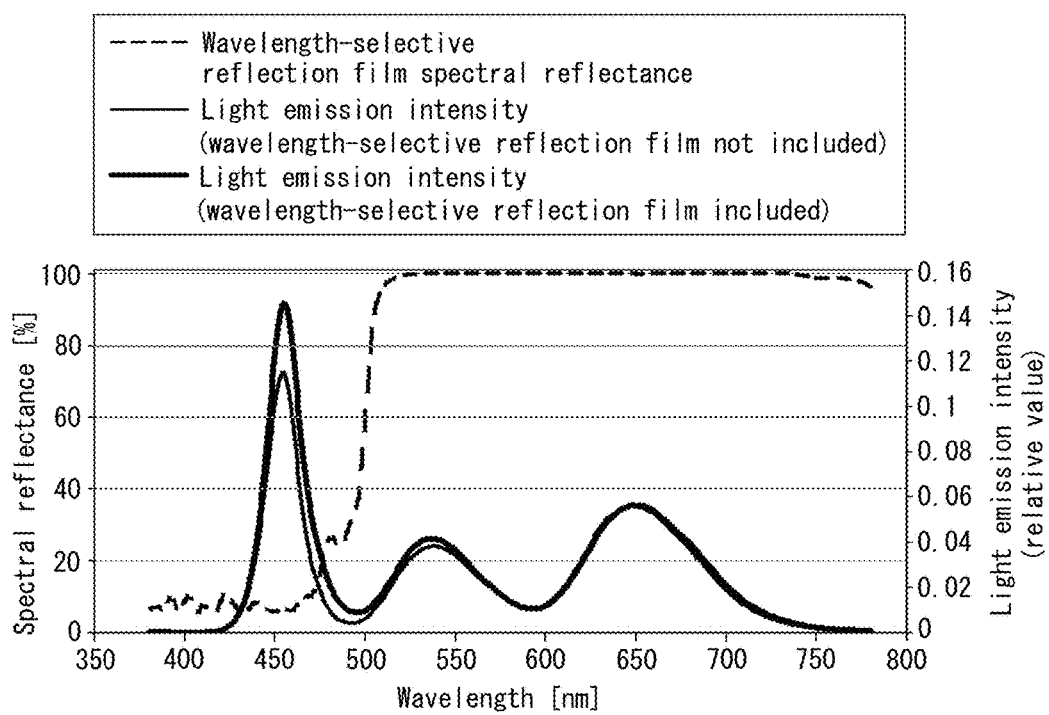
FIG. 9 is a graph illustrating a light emission spectrum of the backlight in Experimental Example 1 and a spectral reflection spectrum of a wavelength-selective reflection film in Experimental Example 1.

A "Dichroic Color Filter (Blue)" produced by Edmund Optics Japan Ltd. was used as the wavelength-selective reflection film 30. The spectral reflection spectrum of this wavelength-selective reflection film 30 is illustrated in FIG. 9, described further below. The phosphor sheet 20 was prepared by dispersion mixing a sulfide phosphor that is excited by blue light and emits green light and a sulfide phosphor that is excited by blue light and emits red light with a binder, applying the resultant mixture onto a PET film, and positioning the wavelength-selective reflection film 30 onto the surface at which the mixture had been applied. The light emission spectra of the green and red light-emitting phosphors used in Experimental Example 1 are illustrated in FIGS. 8B and 8C, respectively. The composition of the phosphors was adjusted such that composite light of the spectra of the blue LEDs 10B, the green light-emitting phosphor, and the red light-emitting phosphor was substantially white light.

The optical sheet group 70 included a prism sheet 71 having a short-side direction as a prism direction (BEF III produced by 3M Company), a prism sheet 72 having a long-side direction as a prism direction (BEF III produced by 3M Company), and a reflection-type polarizing film 73 (DBEF-D400 produced by 3M Company).

The chassis 51 had internal dimensions of 270 mm in width and 180 mm in height. A square grid-shaped array of 9 blue LEDs 10B in width by 6 blue LEDs 10B in height at a pitch of 30 mm in both width and height directions was provided on a bottom surface of the chassis 51 as an excitation light source. A circuit was provided such that switching on and off of the blue LEDs 10B could be controlled in terms of units of 3 blue LEDs 10B in width by 2 blue LEDs 10B in height. Accordingly, overall switching on and off operation was possible for 3 units in width by 3 units in height.

To minimize light loss and improve backlight luminance, a reflection sheet (not illustrated) in which holes were opened only for light emission parts of the blue LEDs 10B was provided on the surface of the chassis 51 on which the blue LEDs 10B were disposed, and light recycling properties were improved. Moreover, side walls of the chassis 51 at the periphery of a region of 270 mm in width by 180 mm in height in which the blue LEDs 10B were disposed were used as a spacer to position optical members in parallel to the mounting surface of the blue LEDs 10B. The spacer had a height of 30 mm and was provided with a reflection sheet (not illustrated) at the inside thereof to reduce light loss in the same way as the surface on which the blue LEDs 10B were disposed. In this manner, a backlight according to Example 1 was produced.

Comparative Example 1

A backlight according to Comparative Example 1 was produced in the same way as in Example 1 with the exception that instead of preparing an integrated sheet 25 formed from a wavelength-selective reflection film 30 and a phosphor sheet 20 as in Example 1, a phosphor sheet 20 without a wavelength-selective reflection film 30 was prepared. In preparation of the phosphor sheet 20, a binder with which the phosphors had been mixed was applied onto a PET film and then a PET film of the same type was laminated therewith.

<Evaluation>

The backlights in Example 1 and Comparative Example 1 were evaluated through (A) backlight light emission spectrum measurement and (B) chromaticity difference evaluation.

(A) Measurement of Backlight Light Emission Spectrum

Figure 10:
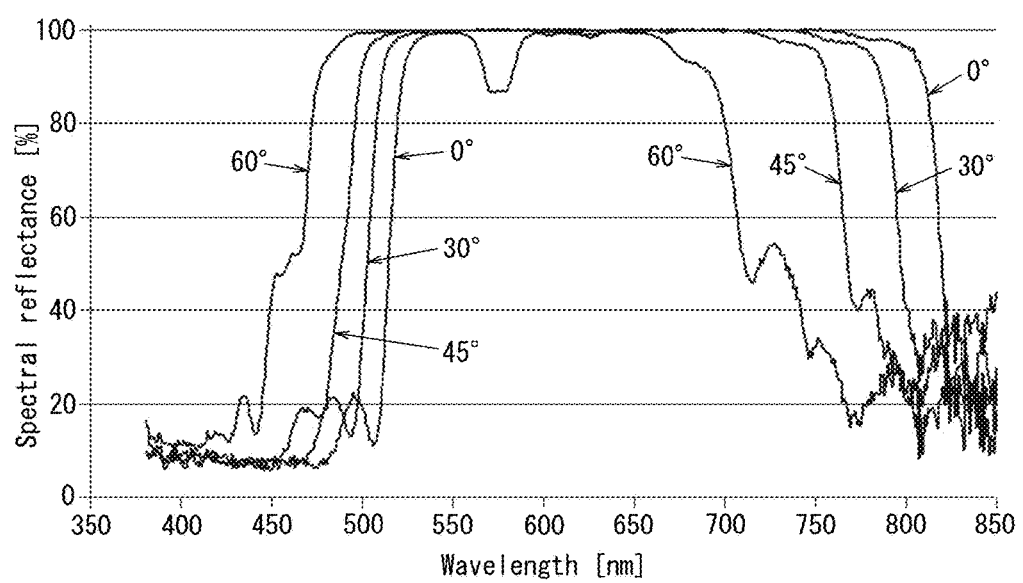
FIG. 10 is a graph illustrating incident angle dependence of spectral reflectance of the wavelength-selective reflection film used in Experimental Example 1.

FIG. 9 illustrates spectra of the backlight in Example 1 and the backlight in Comparative Example 1. FIG. 9 also illustrates spectral reflectance of the wavelength-selective reflection film 30. Note that the spectral reflectance illustrated in FIG. 9 was measured with an incident angle of 0° relative to the wavelength-selective reflection film 30 (i.e., measured with a positioning such that measurement light was incident at a normal to the wavelength-selective reflection film 30). The spectral characteristics of the wavelength-selective reflection film are dependent on the incident angle, and this incident angle dependence is illustrated in FIG. 10.

(B) Evaluation of Chromaticity Difference

Figure 11:
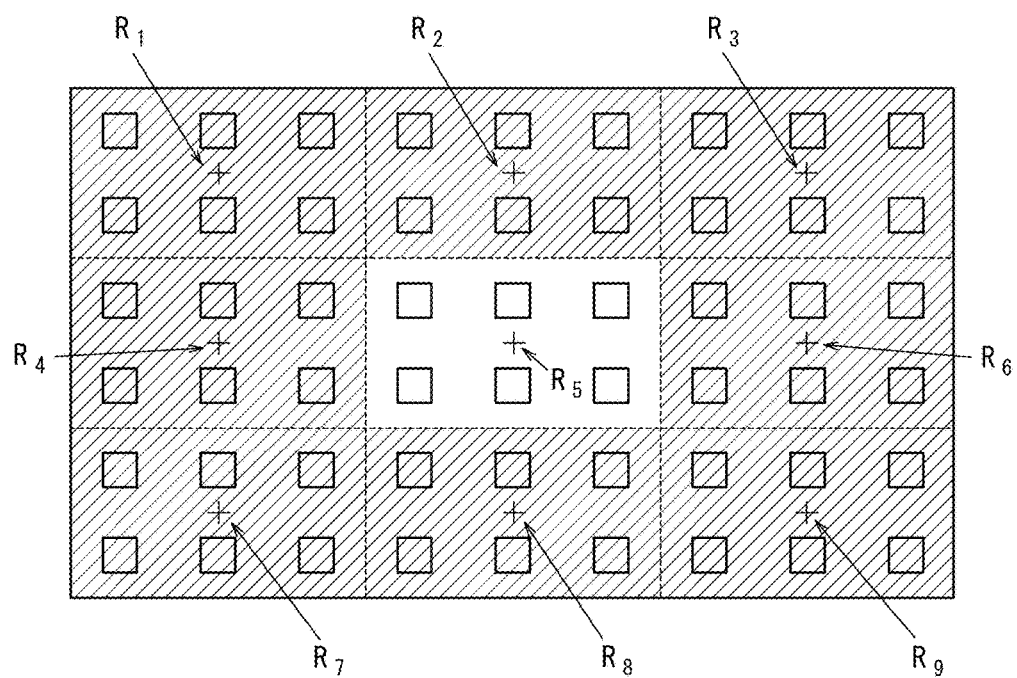
FIG. 11 is a schematic view illustrating measurement regions $R_1$ to $R_9$ for a luminance and chromaticity meter in Experimental Examples 1 and 2.
Figure 12:
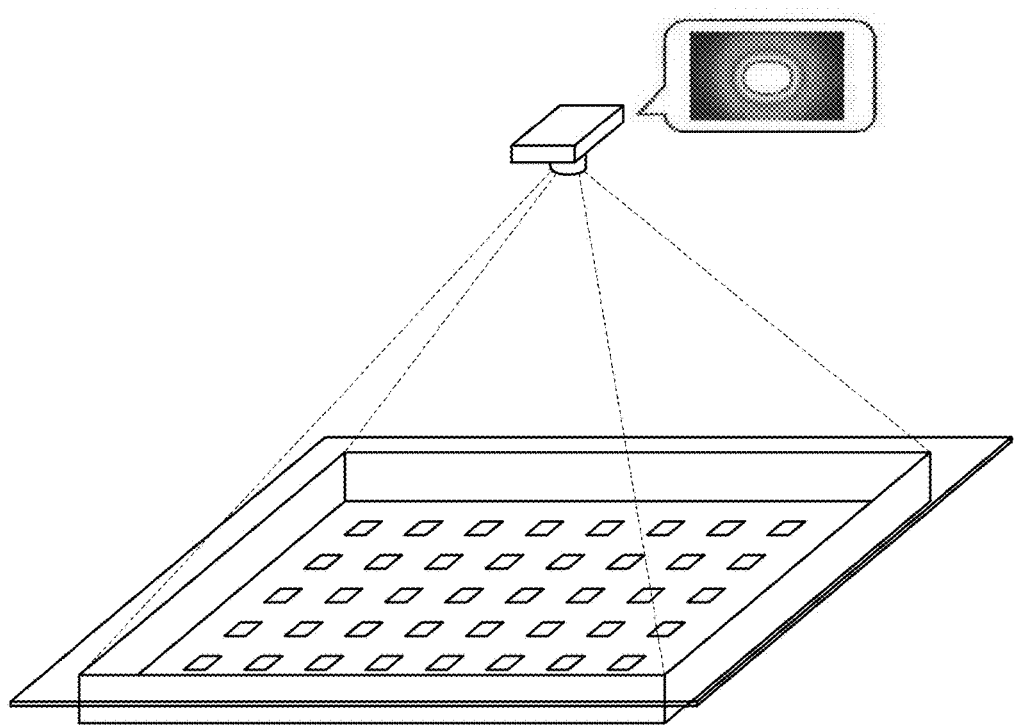
FIG. 12 is a schematic view illustrating a method of measurement using a luminance and chromaticity meter in Experimental Examples 1 to 3.

The backlights according to Example 1 and Comparative Example 1 were each divided into regions $R_1$ to $R_9$ as illustrated in FIG. 11. (Each region was 90 mm in width by 60 mm in height and was configured such that only 3 LEDs in width by 2 LEDs in height were switched on therein). Each of these backlights was partially driven in only the region $R_5$. A camera-type luminance and chromaticity meter (PM-1423F-1 produced by Radiant Imaging, Inc.) was used to measure the luminance and chromaticity of each of the backlights at central positions in the regions $R_2$, $R_4$ to $R_6$, and $R_8$ as illustrated in FIG. 12.

The following measurements and calculations were made to evaluate the chromaticity.

(1) The chromaticity $u'_i$ and $v'_i$ (i=2, 4, 5, 6, 8) was measured at each point.

(2) The differences $\Delta u'_i$ and $\Delta v'_i$ for $u'_1$ and $v'_i$ between the central position of $R_5$ and the central position of each of $R_2$, $R_4$, $R_6$, and $R_8$ were calculated. The square root of the sum of squares $\Delta u'v'_i$ of these differences was taken to be the chromaticity difference between the central position of $R_5$ and a point around a central position of each of $R_2$, $R_4$, $R_6$, and $R_8$. In other words, $\Delta u'v'_i$ was calculated as shown below.

$$\Delta u'v'_i = \sqrt{\{(\Delta u'_i)^2 + (\Delta v'_i)^2\}} = \sqrt{\{(u'_i - u'_5)^2 + (v'_i - v'_5)^2\}}$$

(3) An average value of $\Delta u'v'_i$ for the four points i=2, 4, 6, and 8 was calculated as $\Delta u'v'$ and the calculated average value was used as an indicator of the degree of coloring.

(4) The values of $\Delta u'v'$ for Example 1 and Comparative Example 1 were compared.

In Example 1, $\Delta u'v' = 0.0043$.

In Comparative Example 1, $\Delta u'v' = 0.0645$.

The following was confirmed through these results.

First, it was confirmed from FIGS. 9 and 10 that the integrated sheet 25 in Example 1 was indeed reflecting light emitted from the phosphor sheet 20 (emitted light). In addition, a significant decrease in chromaticity difference between the center of the partially driven region and the surrounding regions was confirmed through comparison of Example 1 and Comparative Example 1. Therefore, it can be concluded that the backlight according to Example 1 enabled extremely effective suppression of coloring through use of the integrated sheet 25 compared to the backlight according to Comparative Example 1. The inventors consider this effect to be due to suppression of diffusion to a switched-off section of light among the emitted light from the phosphor sheet 20 that is diffusely reflected in a space between the diffusing plate and the reflection sheet.

Experimental Example 2

Example 2

A backlight according to Example 2 was produced by producing a backlight in the same way as in Example 1 with the exception that a single wavelength-type YAG phosphor that emitted yellow light was used as a phosphor in the phosphor sheet 20 instead of the sulfide phosphors used in Example 1.

Comparative Example 2

A backlight according to Comparative Example 2 was produced by producing a backlight in the same way as in Comparative Example 1 with the exception that a single wavelength-type YAG phosphor that emitted yellow light was used as a phosphor in the phosphor sheet 20 instead of the sulfide phosphors used in Comparative Example 1.

Figure 13:
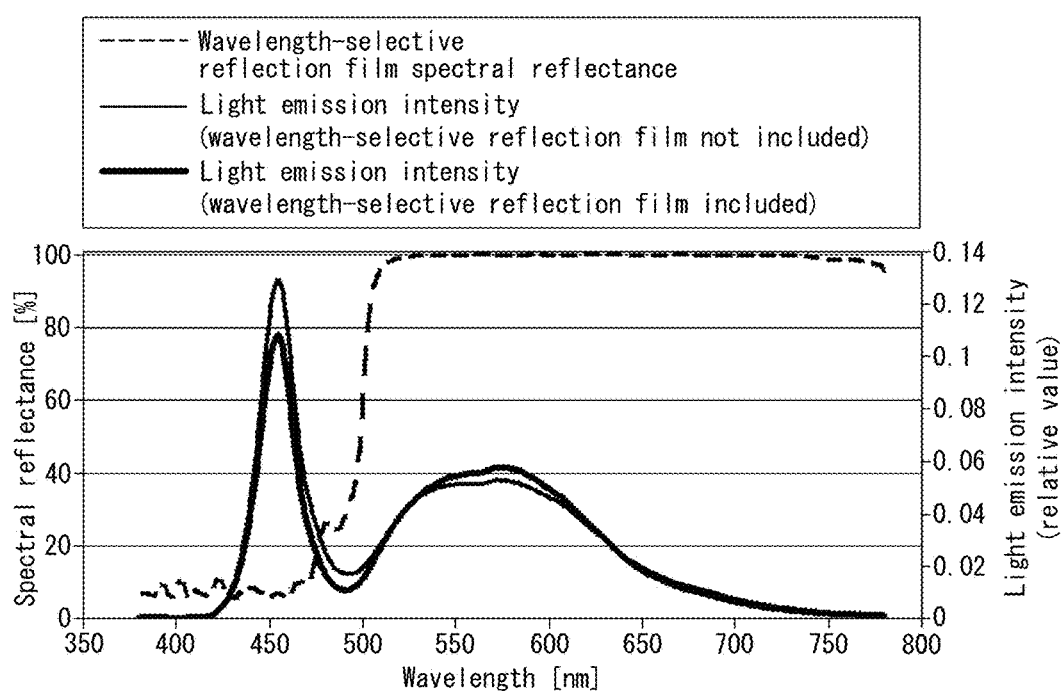
FIG. 13 is a graph illustrating a light emission spectrum of the backlight in Experimental Example 2 and a spectral reflection spectrum of a wavelength-selective reflection film in Experimental Example 2.

The backlights according to Example 2 and Comparative Example 2 were evaluated in the same way as in Experimental Example 1. FIG. 13 illustrates spectra of the backlight in Example 2 and the backlight in Comparative Example 2. The chromaticity difference was measured and calculated in the same way as in Experimental Example 1 and the following results were obtained.

In Example 2, Δu'v'=0.0090.

In Comparative Example 2, Δu'v'=0.0363.

It can be concluded that coloring was extremely effectively suppressed through use of the integrated sheet 25 in Experimental Example 2 in the same way as in Experimental Example 1. Through the results in Experimental Examples 1 and 2, it was confirmed that the effects of the disclosed techniques are not limited by the type of phosphor(s) used in the phosphor sheet.

Examples (2)

Experimental Example 3

Example 3

Figure 14:
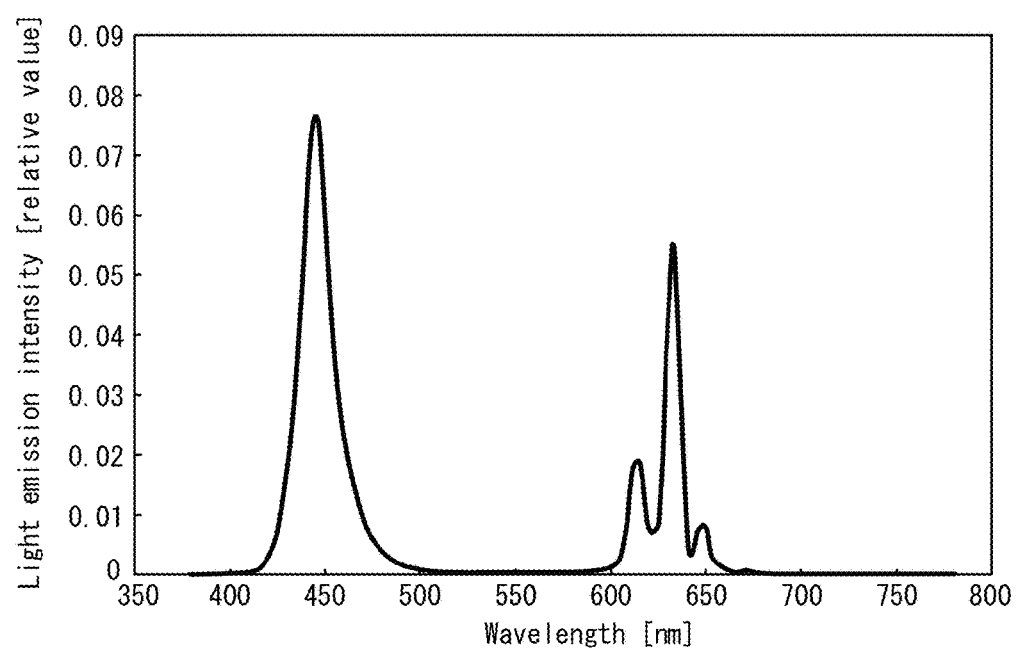
FIG. 14 is a graph illustrating a light emission spectrum of magenta LEDs used in Experimental Example 3.

Magenta LEDs 10M were used as light-emitting elements instead of the blue LEDs 10B used in Experimental Examples 1 and 2. The magenta LEDs 10M were prepared as follows. First, blue LED chips were mounted on a substrate as an excitation light source and then potting was performed using a resin in which a fluoride phosphor that is excited by blue light and emits red light had been dispersed. Blue emitted light from the LEDs had a peak wavelength of 445 nm and a width at half maximum of 18 nm. The LEDs by themselves, prior to potting, had a Lambertian light emission distribution. The potted phosphor-containing resin formed a roughly hemispherical shape with a radius of approximately 1 mm. Through this configuration, the LEDs appeared to be emitting magenta light when switched on due to blue light from the LEDs combining with red light emitted from the fluoride phosphor upon excitation with the blue light emitted from the LEDs. FIG. 14 illustrates a light emission spectrum of the magenta LEDs 10M. The part of the spectrum having a peak at 445 nm is light emission from the blue LED chips and the trimodal part of the spectrum having a peak at 633 nm is light emission from the fluoride phosphor.

Figure 15A:
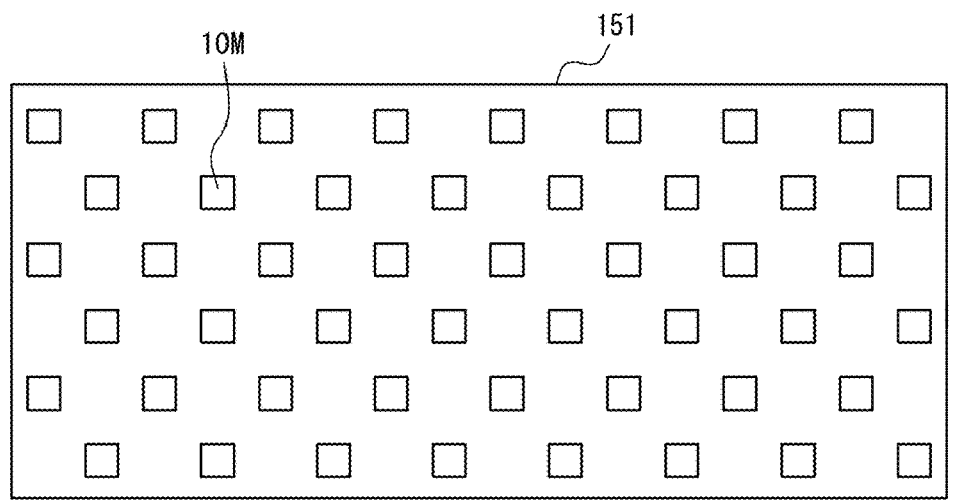
FIG. 15A is a plan view schematically illustrating the positioning of magenta LEDs 10M in a backlight used in Experimental Example 3.
Figure 15B:
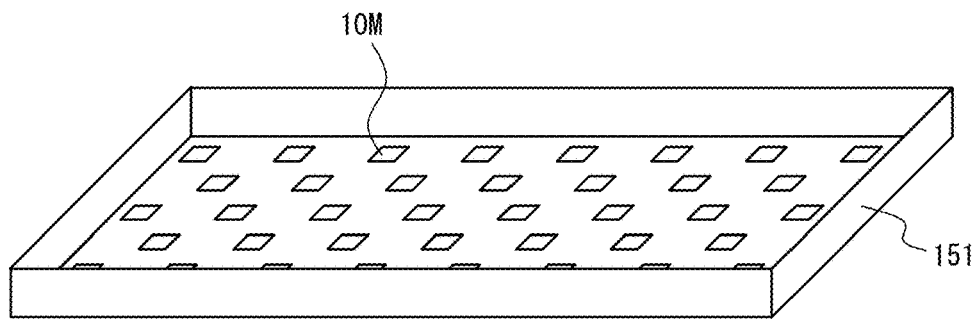
FIG. 15B is a perspective view schematically illustrating positioning of the magenta LEDs 10M in the backlight used in Experimental Example 3.
Figure 15C:
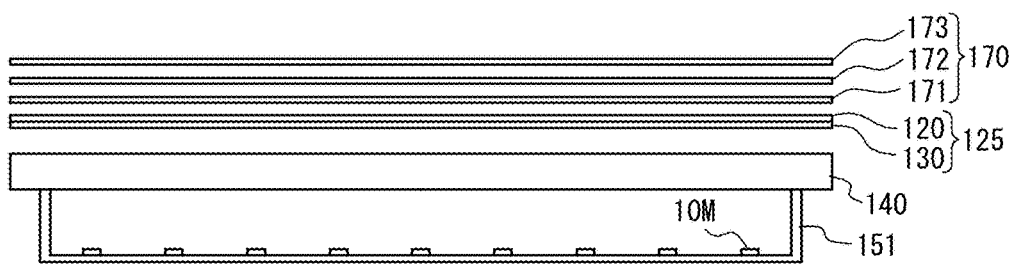
FIG. 15C is a cross-sectional view schematically illustrating the backlight used in Experimental Example 3.

The magenta LEDs 10M were used to produce a backlight such as schematically illustrated in FIGS. 15A to 15C. An array of 48 magenta LEDs 10M was provided on a chassis 151 (backlight bottom surface) in a rhombic grid shape as illustrated in FIG. 15A. The chassis 151 had internal dimensions of 310 mm in width and approximately 132 mm in height. The LEDs were positioned at a pitch of 38.5 mm in a width direction and a pitch of 44 mm in a perpendicular height direction.

To minimize light loss and improve backlight luminance, a reflection sheet (not illustrated) in which holes were opened only for light emission parts of the magenta LEDs 10M was provided on the surface of the chassis 151 on which the magenta LEDs 10M were disposed, and light recycling properties were improved. Side walls at the periphery of the chassis 151 were used as a spacer for positioning optical members in parallel to the mounting surface of the magenta LEDs 10M in the same way as in Examples 1 and 2. The height of the side walls was 30 mm.

A diffusing plate 140, a wavelength-selective reflection film-integrated phosphor sheet 125 (wavelength-selective reflection film 130 positioned at LED side thereof), and an optical sheet group 170 were placed on the side walls in this order as illustrated in FIG. 15C. The optical sheet group included, from a side closest to the LEDs, a diffusing sheet 171 (BS-912 produced by Keiwa Inc.), a prism sheet 172 (BEF III produced by 3M Company), and a reflection-type polarizing film 173 (DBEF-D400 produced by 3M Company).

Figure 16:
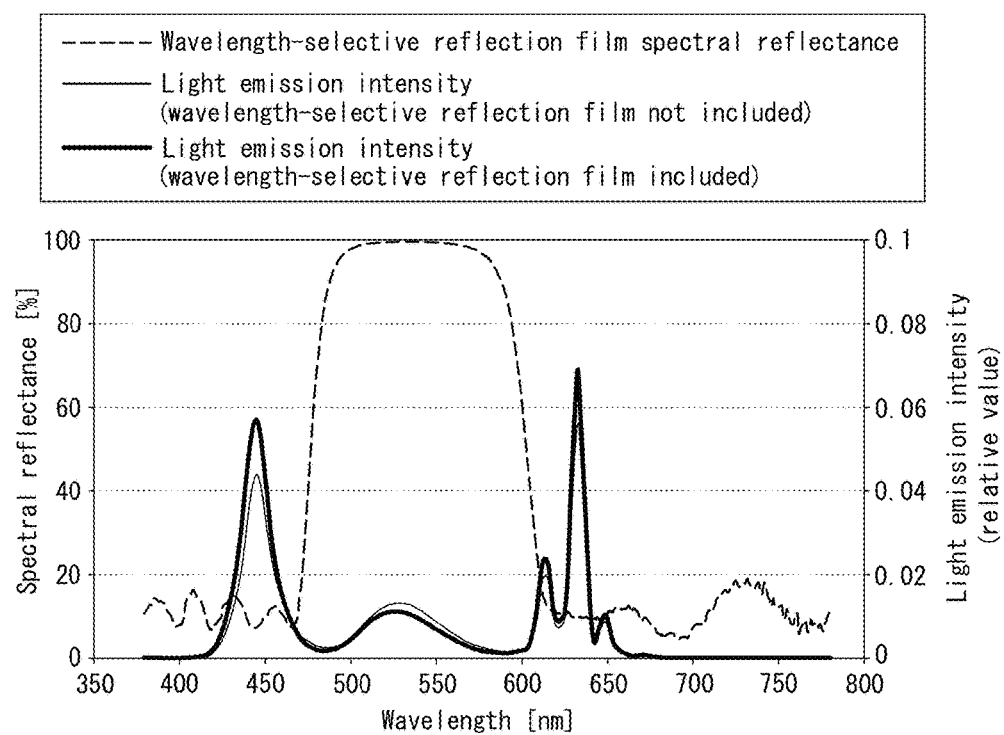
FIG. 16 is a graph illustrating a light emission spectrum of the backlight in Experimental Example 3 and a spectral reflection spectrum of a wavelength-selective reflection film in Experimental Example 3.

Only a sulfide green phosphor was used as a phosphor in the phosphor sheet 120. Through combination of light emitted from this phosphor with blue light from the LEDs and red light from the red phosphor above the LEDs, white light was generated by the backlight as a whole A "Dichroic Color Filter (Magenta)" produced by Edmund Optics Japan Ltd. was used as the wavelength-selective reflection film 130. The spectral reflection spectrum of this wavelength-selective reflection film 130 is illustrated in FIG. 16, described further below.

In this manner, a backlight according to Example 3 was produced.

Comparative Example 3

A backlight according to Comparative Example 3 was produced in the same way as in Example 3 with the exception that instead of preparing an integrated sheet formed from a wavelength-selective reflection film and a phosphor sheet as in Example 3, a phosphor sheet without a wavelength-selective reflection film was prepared. In preparation of the phosphor sheet, a binder with which the phosphor had been mixed was applied onto a PET film and then a PET film of the same type was laminated therewith.

<Evaluation>

The backlights in Example 3 and Comparative Example 3 were evaluated through (A) backlight light emission spectrum measurement and (B) chromaticity difference evaluation.

(A) Measurement of Backlight Light Emission Spectrum

FIG. 16 illustrates spectra of white light from the backlights in Example 3 and Comparative Example 3 together with spectral reflectance of the wavelength-selective reflection film 130. Note that the spectral reflectance illustrated in FIG. 16 was measured with an incident angle of 0° relative to the wavelength-selective reflection film 130 (i.e., measured with a positioning such that measurement light was incident at a normal to the wavelength-selective reflection film 130).

(B) Evaluation of Chromaticity Difference

Figure 17:
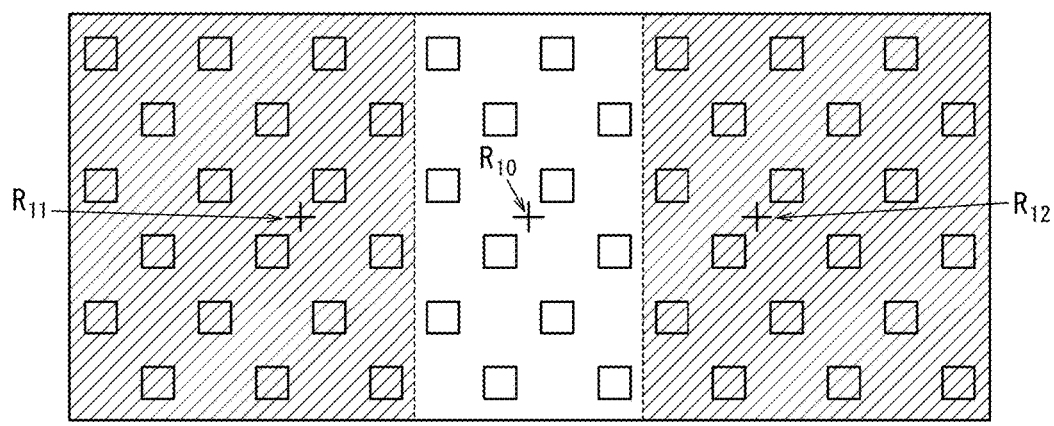
FIG. 17 is a schematic view illustrating measurement regions $R_{10}$ to $R_{12}$ for a luminance and chromaticity meter in Experimental Example 3.

Since the chassis in Experimental Example 3 had a long and thin shape compared to the chassis in Experimental Examples 1 and 2, a central section of the backlight was switched on in the height direction as illustrated in FIG. 17 (i.e., 12 LEDs in a central section of FIG. 17 were switched on), a chromaticity distribution was measured in the width direction of the backlight, and the effect of coloring suppression was evaluated through comparison with a case in which all the LEDs were switched on. In other words, a camera-type luminance and chromaticity meter was used to measure the luminance and chromaticity of the backlight in the same way as in EXAMPLES (1) at measurement points in regions $R_{10}$ to $R_{12}$ indicated in FIG. 17. Specifically, the measurement point in $R_{10}$ was a central screen position and the measurement points in $R_{11}$ and $R_{12}$ were midpoints between the center and side wall sections of the backlight on a longitudinal axis of the backlight.

The chromaticity was evaluated by the following measurements and calculations.

(1) The chromaticity $u'_i$ and $v'_i$ (i=10, 11, 12) was measured at each point.

(2) The differences $\Delta u'_i$ and $\alpha v'_i$ (i=11, 12) for $u'_i$ and $v'_i$ between the measurement point of $R_{10}$ and the measurement point of each of $R_{11}$ and $R_{12}$ were calculated. The sum of squares $\Delta u'v'_i$ of these differences was taken to be the chromaticity difference between $R_{10}$ and $R_{11}$ and between $R_{10}$ and $R_{12}$. In other words, $\Delta u'v'_i$ was calculated as shown below.

$$\Delta u'v'_i = \sqrt{\{(\Delta u'_i)^2 + (\Delta v'_i)^2\}} = \sqrt{\{(u'_i - u'_{10})^2 + (v'_i - v'_{10})^2\}}$$

(3) An average value of $\Delta u'v'_i$ for the two points i=11 and 12 was calculated as $\Delta u'v'$ and the calculated average value was used as an indicator of the degree of coloring.

(4) The values of $\Delta u'v'$ for Example 3 and Comparative Example 3 were compared.

In Example 3, $\Delta u'v'=0.0102$.

In Comparative Example 3, $\Delta u'v'=0.0283$.

Through the above results, it was confirmed that coloring can be suppressed in the same way as in the configurations of Examples 1 and 2 even when a phosphor is used on the surface of LEDs, such as in a configuration with magenta LEDs and a green phosphor sheet, by selecting a wavelength-selective reflection film having optical properties that are suitable for the adopted configuration.

INDUSTRIAL APPLICABILITY

According to this disclosure, it is possible to provide a partial drive-type light source device capable of suppressing coloring of a section intended to be a dark section when a plurality of light-emitting elements is driven in a partial manner.

REFERENCE SIGNS LIST 1 partial drive-type light source device
10 light-emitting element
10B blue LED
10M magenta LED
20 phosphor sheet
25 integrated sheet
30 wavelength-selective reflection film
40 diffusing plate

The invention claimed is:

1. A partial drive-type light source device comprising:
an excitation light source that is formed from a plurality of light-emitting elements and is partially drivable;
a phosphor sheet disposed at a position separated from the excitation light source and containing a phosphor that converts at least part of a wavelength region of incident light from the excitation light source and releases emitted light in a wavelength region differing from the incident light; and
a wavelength-selective reflection film that is disposed between the excitation light source and the phosphor sheet and that transmits at least part of light in the wavelength region of the incident light from the excitation light source and reflects at least part of light in the wavelength region of the emitted light from the phosphor sheet;
a diffusing plate disposed between the excitation light source and the wavelength-selective reflection film, the diffusing plate having a first main surface, a second main surface which is opposite to the first main surface, and at least one side surface; and
an optical sheet group disposed above the phosphor sheet, wherein
the plurality of light-emitting elements of the excitation light source is in a grid-shaped array, and
the diffusing plate is arranged so that the first main surface of the diffusing plate faces toward the excitation light source, the second main surface of the diffusing plate faces toward the wavelength-selective reflection film, and the first main surface of the diffusing plate receives a light from the excitation light source directly.

2. The partial drive-type light source device according to claim 1, wherein
the diffusing plate functions as at least part of a support for the wavelength-selective reflection film and the phosphor sheet.

3. The partial drive-type light source device according to claim 1, wherein
the phosphor sheet and the wavelength-selective reflection film are disposed adjacently.

4. The partial drive-type light source device according to claim 1, wherein
the phosphor sheet and the wavelength-selective reflection film are in an integrated form.

5. The partial drive-type light source device according to claim 1, wherein
the plurality of light-emitting elements are blue LEDs.

6. The partial drive-type light source device according to claim 5, wherein
the wavelength-selective reflection film transmits at least part of a light emission wavelength region of the blue LEDs and reflects at least part of light in a wavelength region from green to red.

7. The partial drive-type light source device according to claim 1, wherein
the plurality of light-emitting elements are magenta LEDs.

8. The partial drive-type light source device according to claim 7, wherein
the magenta LEDs are each formed from a blue LED and a red phosphor disposed on a chip upper surface of the blue LED.

9. The partial drive-type light source device according to claim 8, wherein
the red phosphor is a fluoride red light-emitting phosphor.

10. The partial drive-type light source device according to claim 9, wherein
the fluoride red light-emitting phosphor is $K_2SiF_6$.

11. The partial drive-type light source device according to claim 7, wherein
the wavelength-selective reflection film transmits at least part of a light emission wavelength region of the magenta LEDs and reflects at least part of light in a green wavelength region.

12. The partial drive-type light source device according to claim 1, wherein
the phosphor of the phosphor sheet is a sulfide phosphor.

13. The partial drive-type light source device according to claim 12, wherein
the sulfide phosphor includes either or both of a red sulfide phosphor and a green sulfide phosphor.

14. The partial drive-type light source device according to claim 13, wherein
the red sulfide phosphor is a calcium sulfide phosphor and the green sulfide phosphor is a thiogallate phosphor.

15. The partial drive-type light source device according to claim 1, wherein
the phosphor of the phosphor sheet is an yttrium cerium aluminum garnet phosphor.

16. An image display device comprising the partial drive-type light source device according to claim 1.

17. A partial drive-type light source device comprising:
an excitation light source that is formed from a plurality of light-emitting elements and is partially drivable;

a phosphor sheet disposed at a position separated from the excitation light source and containing a phosphor that converts at least part of a wavelength region of incident light from the excitation light source and releases emitted light in a wavelength region differing from the incident light; and a wavelength-selective reflection film that is disposed between the excitation light source and the phosphor sheet and that transmits at least part of light in the wavelength region of the incident light from the excitation light source and reflects at least part of light in the wavelength region of the emitted light from the phosphor sheet;

a diffusing plate disposed between the excitation light source and the wavelength-selective reflection film, the diffusing plate having a first main surface, a second main surface which is opposite to the first main surface, and at least one side surface; and an optical sheet group disposed above the phosphor sheet, wherein the plurality of light-emitting elements is in a grid-shaped array, and the diffusing plate is arranged so that the first main surface of the diffusing plate faces toward the plurality of light-emitting elements, the second main surface of the diffusing plate faces toward the wavelength-selective reflection film, and the first main surface of the diffusing plate receives a light from the plurality of light-emitting elements directly.

* * * * *